United States Patent [19]

Nippert et al.

[11] Patent Number: 4,710,795
[45] Date of Patent: Dec. 1, 1987

[54] SEMICONDUCTOR POWER MODULE

[75] Inventors: Georg Nippert, Worms; Berthold Hahn, Lampertheim, both of Fed. Rep. of Germany; Jens Gobrecht, Gebenstorf, Switzerland

[73] Assignee: Brown, Boveri & CIE Aktiengesellschaft, Mannheim-Kaefertal, Fed. Rep. of Germany

[21] Appl. No.: 705,089

[22] Filed: Feb. 25, 1985

[30] Foreign Application Priority Data

Feb. 23, 1984 [DE] Fed. Rep. of Germany ....... 3406528

[51] Int. Cl.[4] .................. H01L 21/447; H01L 23/10; H01L 23/40; H01L 23/14
[52] U.S. Cl. ....................................... 357/65; 357/68; 357/79; 357/74
[58] Field of Search ...................... 357/80, 74, 72, 75, 357/68, 65, 71, 79

[56] References Cited

U.S. PATENT DOCUMENTS 3,786,375  1/1974  Sato et al. ............................. 357/74
4,172,261 10/1979  Tsuzuki et al. ....................... 357/80
4,259,684  3/1981  Dean et al. ........................... 357/80
4,538,170  8/1985  Yerman ................................. 357/80

Primary Examiner—Andrew J. James
Assistant Examiner—S. V. Clark
Attorney, Agent, or Firm—Herbert L. Lerner; Laurence A. Greenberg

[57] ABSTRACT

A semiconductor power module includes at least two mutually parallel ceramic substrates each having two sides, metallizations disposed on at least one side of each of the substrates, at least one controlled semiconductor power component disposed between each two respective substrates and contacted by the metallizations above and below the component, the substrate above the component having at least one hole formed therein above the component for accommodating control connections to the component.

19 Claims, 7 Drawing Figures

SEMICONDUCTOR POWER MODULE

The invention relates to a semiconductor power module having at least two mutually parallel ceramic plates or substrates being metallized on at least one side thereof. Such electrically insulated modules have a bottom plate, a ceramic plate metallized on one or both sides thereof, as well as at least one further ceramic plate disposed parallel thereto.

Static converter circuits can be constructed entirely or partially with semiconductor power modules. To the extent that the required connections of the individual elements cannot be formed with conductor runs of the substrate or metallized ceramic, contact loops or clips are used for the connection or connections, or after soldering the semiconductor chips onto the substrate, the connections are made by hand. In order to fix the semiconductor chips, contact loops or other parts in place, a soldering form is required so that the parts are kept in their position during the soldering operation. This soldering form is an expensive precision part and causes a number of further disadvantages. Since the form is removed again after the soldering operation, all of the parts must have some play or tolerance in the soldering form. Generally, these parts are displaced during soldering within these tolerances; in the worst case, several semiconductor chips rest with their edges against the soldering form and are damaged upon removal from the form. Therefore, the entire module is rejected. An additional disadvantage is that in the case of pure hand soldering as well as when contact loops are used, a minimum size of the ceramic substrate must be maintained. This size is not determined by the size of the chips used, but rather by technical capabilities during the fabrication of the soldering form. This size generally far exceeds the size which would be necessary for accommodating the chips, since a minimum width of the land must be maintained for guiding the contact loops. It is a further disadvantage of the prior art devices that no physical separation of connections carrying the load current and of auxiliary connections for control purposes, is possible. Different types of contact loops are also necessary in complex modules, standardization of the individual assembly parts is only possible to a small degree.

A module with several substrates disposed on top of each other is known from German Published, Non-Prosecuted Application DE-OS No. 31 37 570 (FIG. 6 and the corresponding description). In such a device, contact is only made with the semiconductor components on each plate on the upper surface thereof. Electrical connections are made thereon through the use of contact loops, and for soldering, either an expensive soldering form or soldering by hand is required. German Patent DE-PS No. 29 39 732 describes a semiconductor diode arrangement in which a module with a sandwich-like construction is proposed. In this case, semiconductor diode chips are disposed between metallic ceramic plates. A common lower ceramic plate and several upper ceramic plates are provided. Neither controlled power semiconductors nor a hybrid arrangement of power semiconductors and integrated circuits for information processing or for driving power semiconductors, are provided.

It is accordingly an object of the invention to provide a semiconductor power module which overcomes the hereinaforementioned disadvantages of the heretofore-known devices of this general type, and which contains at least one controlled power semiconductor.

With the foregoing and other objects in view there is provided, in accordance with the invention, a semiconductor power module, comprising at least two mutually parallel ceramic substrates or plates each having two sides, metallizations disposed on at least one side of each of the substrates, at least one controlled semiconductor power component disposed between each two respective substrates and contacted by the metallizations above and below the component either directly or through compensating pieces, the substrate above the component having at least one hole formed therein above the component for accommodating control connections to the component.

In accordance with another feature of the invention, there is provided a device which includes a housing enclosing the substrates and casting compound at least partially filling the housing.

In accordance with a further feature of the invention, the metallization on at least one side of each of the substrates is structured to form conductor runs.

In accordance with an added feature of the invention, the sides of the substrates define conductor run planes, the metallizations are conductor runs disposed on two of the planes facing each other, and including contact parts interconnecting the conductor runs.

In accordance with an additional feature of the invention, there is provided a device which includes auxiliary control circuits disposed separate from the component or load circuit on one of the conductor run planes other than the two planes.

In accordance with still another feature of the invention, there is provided a device which includes compensating pieces disposed between the component and the substrates for compensating height differences and/or mechanical stresses.

In accordance with still a further feature of the invention, there is provided a device which includes electrically insulating, heat resistant centering pins disposed in the at least one hole for positioning the component or other components in the module before and during soldering.

In accordance with an additional feature of the invention, there is provided a device which includes centering sleeves disposed in the at least one hole formed in the cover plate above the component and in an opening formed in one of the compensating pieces above the component for positioning the component or components.

In accordance with again an added feature of the invention, the component or sandwich includes a gate terminal, the substrates are cover and base plates, the sides of the substrate define conductor run planes, the metallizations are conductor runs disposed on at least some of the planes, and including auxiliary control circuits disposed on one of the conductor runs on the cover plate facing away from the component, and a sleeve for positioning the component disposed in the hole having a rim with metallizations connecting conductor runs on both sides of the cover plate and, connecting the gate terminal to the conductor run for the auxiliary circuits.

In accordance with still an additional feature of the invention, the contact posts have contact surfaces contacting the conductor runs at given locations of the conductor runs fitted to the contact surface, the posts being held at the locations by capillary force during soldering.

In accordance with still an added feature of the invention, the component includes a gate terminal, the sides of the substrates define conductor run planes, the metallizations are conductor runs disposed on the planes, and including auxiliary circuits disposed on one of the conductor runs, and presoldered contact wires passing through the hole and connecting the gate terminal to the conductor run on which the auxiliary circuits are disposed.

In accordance with still an additional feature of the invention, the substrates are base and cover plates, and the base plate is larger than the cover plate or other substrates above the base plate.

In accordance with still a further feature of the invention, the metallizations are disposed on the substrates by direct bonding.

In accordance with again another feature of the invention, the substrates are base and cover plates, and including a heat sink contacting the base plate.

In accordance with again a further feature of the invention, there is provided a device which includes a heat sink contacting the upper surface of the substrate disposed above the component.

In accordance with still an additional feature of the invention, there is provided a device which includes contact pins emerging laterally to the surroundings from the module.

In accordance with still an added feature of the invention, there is provided a built-in integrated circuit with addressing and control functions.

In accordance with a concomitant feature of the invention, the substrates are in the form of an upper substrate and a base plate respectively forming a cover and a bottom of a housing.

The placement of semiconductor components between at least two parallel substrates according to the invention has the following advantages:

No complicated soldering forms are necessary. During preparation for the soldering operation, the individual parts are merely inserted into a simple soldering frame. This insertion operation can be performed by means of an automatic insertion machine. All electrical connections between the individual components and connections to plug connectors can be provided by means of conductor runs on ceramic or by contact posts between substrates. As compared with the conventional structure of semiconductor power modules, a very compact construction is obtained which allows for small casings. Fewer parts are needed which can additionally be standardized. Changes in the module structure can be made more simply and only a few operating steps are needed for the manufacture of the modules. Power circuits and control circuits can be divided up into different conductor run planes.

The positioning of parts before and during the soldering process can be accomplished in different ways. For this purpose, for instance, ceramic centering pins which are placed in holes in the cover plate and removed again after the soldering are suitable. The pins are therefore reusable. Centering sleeves through which a contact wire, such as a pre-bent contact hook can be guided, are suitable for components with a gate-terminal. According to a further advantageous embodiment, the ceramic sleeve can be used for making electrical connections besides for positioning, the sleeve being provided with a metallization at suitable locations.

Terminals can either be brought upwards or laterally out of the module. Terminals which are brought out laterally can be particularly advantageous if heat sinks are provided on top as well as at the bottom of the module.

Other features which are considered as characteristic for the invention are set forth in the appended claims.

Although the invention is illustrated and described herein as embodied in a semiconductor power module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
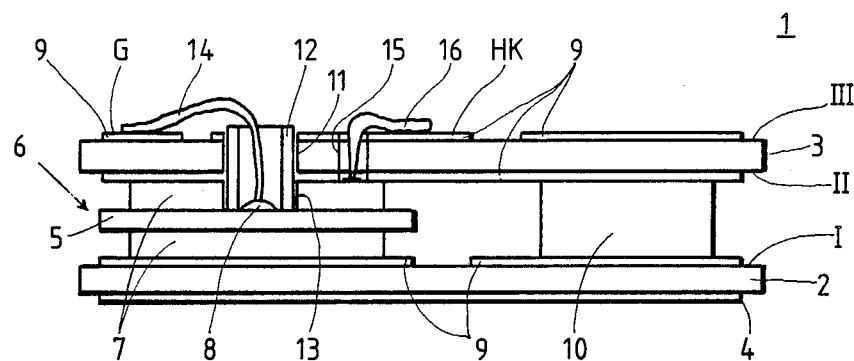
FIG. 1 is a cross-sectional view of a semiconductor power module with two substrates disposed on top of each other and interposed semiconductor chips.

Referring now to the figures of the drawings in detail and first particularly to FIG. 1 thereof, there is seen a cross-sectional view of a semiconductor power module 1 which includes two substrates, namely a base plate 2 which is metallized on both sides thereof, and a cover plate 3 which is likewise metallized on both sides. However, constructions are possible in which no metallization 4 is provided on the bottom side or surface of the base plate 2. Preferably, the substrates 2, 3 are fabricated by direct bonding with copper or ceramic, because the adhesion of the metallization 4 is good in such devices.

Controlled semiconductor power elements 5 and optionally, further components, are disposed between the base plate 2 and the cover plate 3. In the illustrated embodiment, a prefabricated and presoldered semiconductor sandwich 6 is provided which is formed of a semiconductor component 5 and compensator pieces 7 above and below the semiconductor component 5. The upper compensation piece 7 has an opening 13 formed in the middle thereof in vicinity of a presoldered gate terminal 8 of the semiconductor component 5. The semiconductor component 5 which is shown is a thyristor. Compensation pieces 7 are advantageous for compensating differences in height and mechanical stresses. They are advantageously made of molybdenum. However, compensating pieces 7 are not necessary in every case.

The metallized upper surface or side of the base plate 2 and both sides of the cover plate 3 are etched in accordance with the desired conductor run structure. The upper side of the base plate 2 is designated as a conductor run plane I, the bottom side of the cover plate 3 as a conductor run plane II and the upper side of the cover plate 3 as a conductor run plane III. The conductor run planes I and II are provided for connections which carry the load current and the conductor run plane III is provided for auxiliary connections for controlling the semiconductor components 5. The conductor run plane III or additional conductor run planes can also be equipped with electronic components, such as integrated circuits, for addressing the semiconductor components 5 or for performing control functions. Electrical connections between conductor runs 9 of the plane I and plane II are established by contact legs 10. In this way, complicated circuits can also be provided by distributing the line connections over several planes.

According to the structure described above, more than two substrates 2, 3 can also be disposed on top of each other, while always having interposed components 6, 10. A compact construction can be achieved in this way, particularly if the dissipation heat to be removed is not very large.

The construction according to the invention is suited not only for providing static converter circuits with several controlled semiconductor power components 5, but also for the fabrication of components with only one semiconductor element 5.

FIG. 1 also shows a possible construction of the mounting or attachment of the sandwich 6 and the establishment of contact connections to the plane III.

The components 6, 10 between the substrates 2, 3 must be positioned at the correct location and fixed in place during the soldering process. One advantageous non-illustrated possibility is the adaptation of the form of the conductor run 9 on the plane I and/or II to the surfaces of the components 6, 10 to be contacted, in such a manner that the components 6, 10 are held in the correct location by capillary force during the soldering process. In this manner, the contact leg shown in FIG. 1, for instance, can be fixed in place. A hole 11 is formed in the cover plate 3 in the illustrated embodiment for positioning the semiconductor sandwich 6. A ceramic centering sleeve 12 can be placed in the hole 11 so that it extends into the opening 13 formed in the upper compensating piece 7.

The required electrical connection between the gate terminal 8 and a conductor run 9 for a gate contact G on the conductor run plane III, is made by a contact wire 14 which is brought through the centering sleeve 12. A further hole 15 is provided in the cover plate 3 in vicinity of the hole 11, through which a cathode wire 16 is conducted for making an auxiliary cathode contact HK. A heat sink may be provided on the upper surface of the substrate 3 or on the lower surface of the substrate 2.

Figure 2:
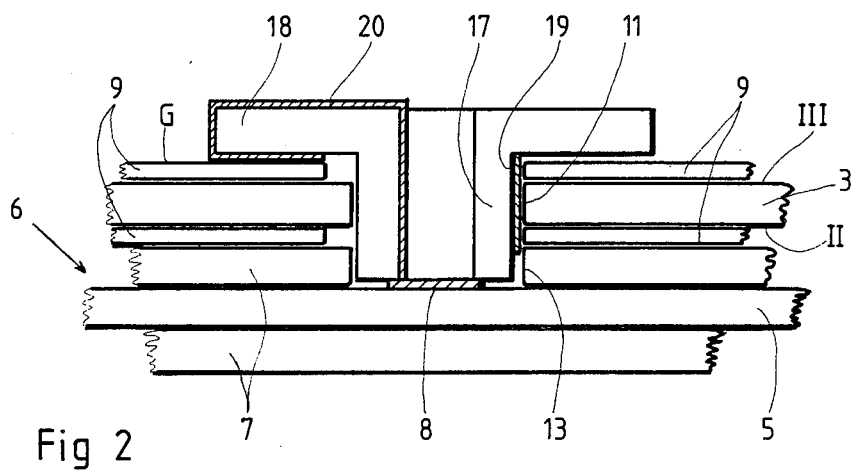
FIG. 2 is an enlarged view of another embodiment of the device in which a semiconductor chip is fixed in place and the electrical connections are made by using metallized ceramic sleeves.

FIG. 2 is an enlarged view of another embodiment for positioning a sandwich 6 and for making contact connections to the conductor run plane III. For this purpose, a ceramic sleeve 17 with a sleeve rim 18 is provided. The sleeve 17 carries a metallization 19, 20 in certain locations. An electrical connection between conductor runs 9 of the planes II and III can be made with the metallization 19 provided in the outer region of the sleeve 17. The necessary connection between the gate terminal at the semiconductor component 5 and a conductor run 9 in the plane III which leads to a gate contact G, can be made with the metallization 20, which begins at the inner region of the sleeve 17 and leads over the rim 18. As in the embodiment according to FIG. 1, the sandwich 6 of FIG. 2 can be positioned due to the fact that the sleeve 17 extends through the hole 11 formed in the cover plate 3 into the opening 13 formed in the upper compensating piece 7. All of the metal surfaces to be connected to each other are precoated with solder, so that the connections are made automatically during the soldering process. This is known as the reflow process.

The embodiment shown in FIG. 2 is particularly well suited for machine insertion and therefore an automated production.

Figure 3:
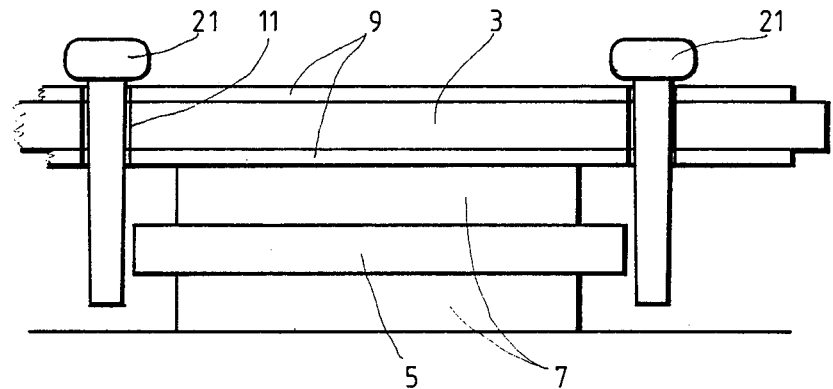
FIG. 3 is an enlarged view of a further embodiment of the device in which the components are fixed in place by means of ceramic centering pins.

FIG. 3 shows a structure for positioning semiconductor components 5 or other components, wherein ceramic centering pins 21 are provided as assembly aids. The centering pins 21 are plugged through the holes 11 in the cover plate 3 and disposed about the component 5 in such a way that the component 5 is held between the pins 21 before and during the soldering process. In the case of circular components 5, three centering pins 21 are provided which can be removed again after the soldering operation.

FIGS. 4 to 7 show an embodiment of a three-phase bridge circuit. The device for positioning the semiconductor components 5 between the planes I and II and for making the electrical connections to the plane III as shown in FIG. 1, is taken as the basis for the circuit.

Figure 4:
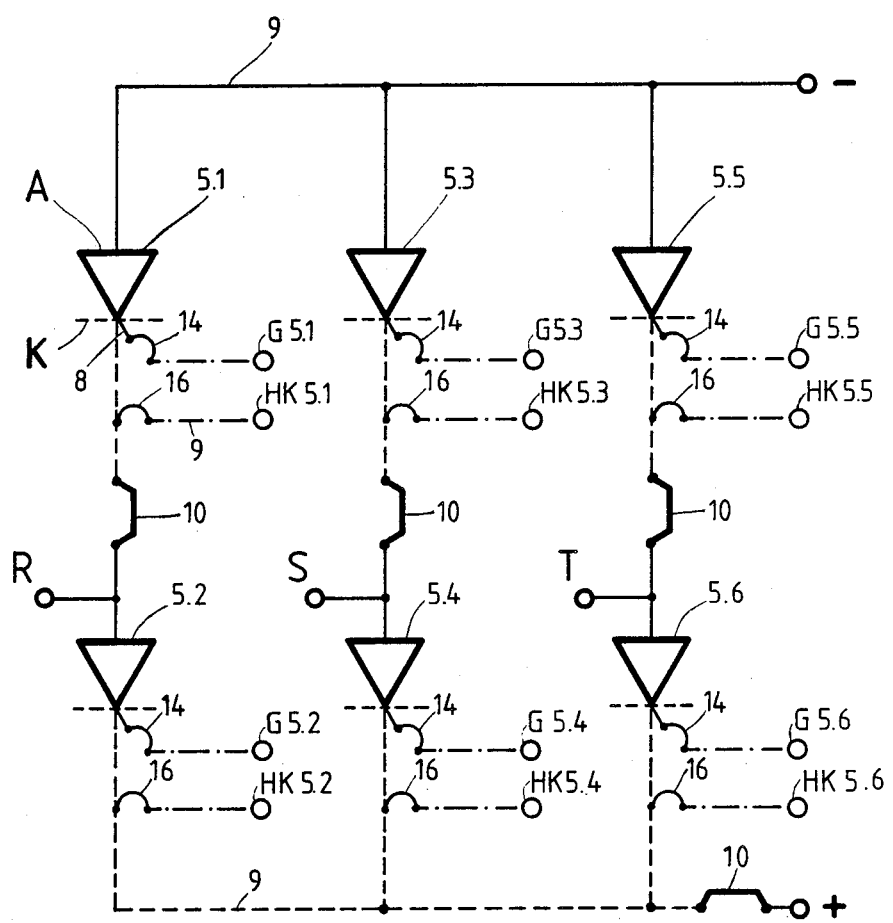
FIG. 4 is a schematic circuit diagram of a three-phase bridge circuit.

FIG. 4 shows a conventional three-phase bridge circuit with six thyristors 5.1 to 5.6 for converting three-phase current into d-c current. The anodes A of the first thyristor 5.1 and the third and fifth thyristors 5.3 and 5.5 are connected to each other and to the minus or negative terminal. The cathodes K of the second, fourth and sixth thyristors 5.2, 5.4 and 5.6 are connected to each other and to the plus or positive terminal. The cathode K of the thyristor 5.1 is connected to the anode A of the thyristor 5.2 and a phase contact R; the cathode K of the thyristor 5.3 is connected to the anode A of the thyristor 5.4 and to a phase contact S; and the cathode K of the thyristor 5.5 is connected to the anode A of the thyristor 5.6 and to a phase contact T.

A semiconductor power module 1 with two substrates 2, 3 is provided for constructing the three-phase bridge circuit. FIG. 4 shows not only the electric circuit diagram of the three-phase bridge circuit, but also the subdivision of the conductor arrangement into the conductor run planes I to III on the substrates 2, 3. The conductor runs 9 on the conductor run plane I are indicated by solid lines. The conductor runs 9 in the plane II are shown as dashed lines, and conductor runs 9 in the plane III are shown as dot-dash lines.

In addition, FIG. 4 shows at which points of the circuit contact posts for connecting the planes I and II are provided. FIG. 4 also shows the contact wires 14, shown in FIG. 1, for connecting the gate terminals 8 to one of the gate contacts G5.1 to G5.6 through conductor runs 9 in the plane III. Finally, FIG. 4 shows cathode wires 16 for connecting one of the respective auxiliary cathode contacts HK5.1 to HK5.6 through conductor runs 9 of the plane III.

Figure 5:
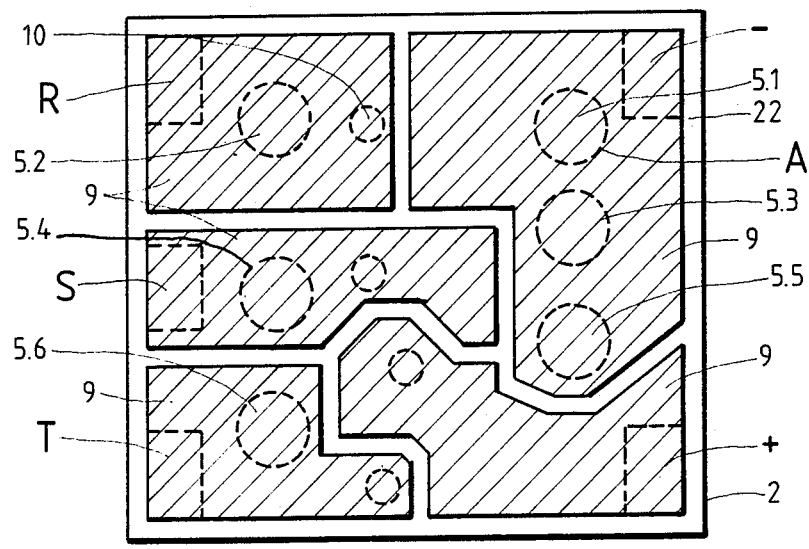
FIG. 5 is a top-plan view of a base plate of an embodiment of a three-phase bridge circuit.
Figure 6:
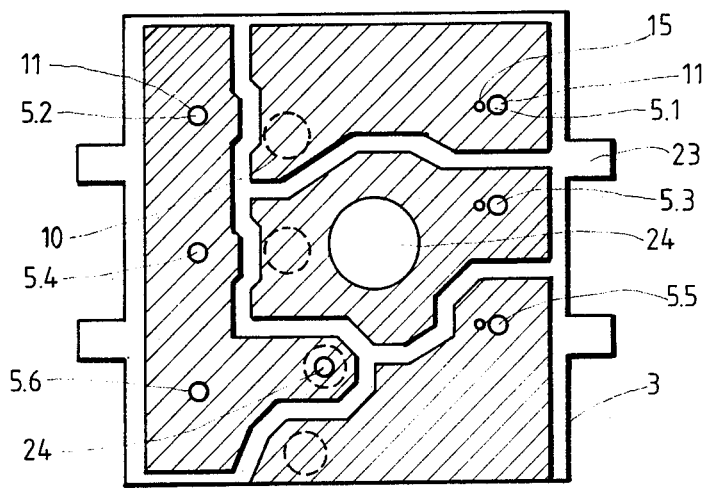
FIG. 6 is a bottom-plan view of a cover plate of an embodiment of a three-phase bridge circuit.
Figure 7:
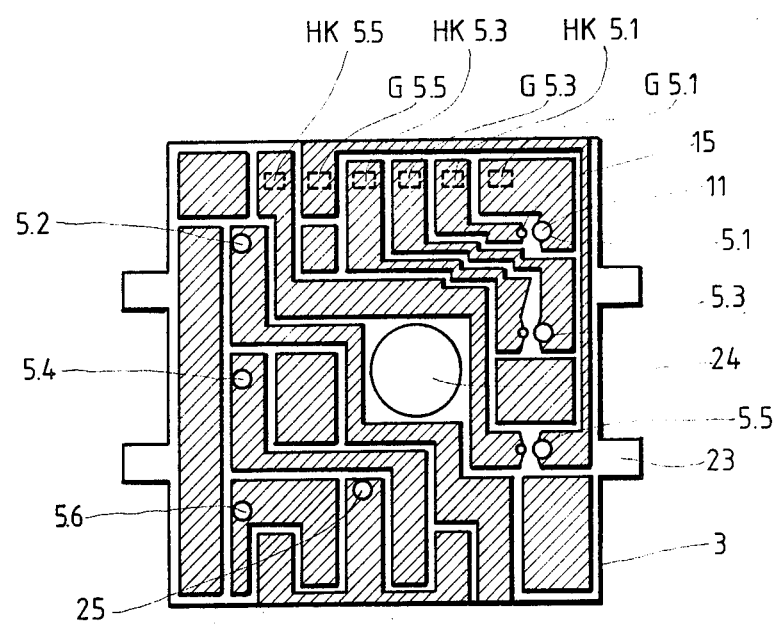
FIG. 7 is a top-plan view of a cover plate of the three-phase bridge circuit.

FIGS. 5 to 7 show the conductor run structures of the three-phase bridge circuit from FIG. 4 on the conductor run planes I to III. FIG. 5 shows the structure of the conductor runs 9 in the conductor run plane I on the upper side of the base plate 2. The metallized areas of the conductor runs 9 do not quite extend to the edge of the base plate 2, so that a non-metallized edge strip 22 is left, on which a non-illustrated plastic housing can be placed and cemented, for instance.

Large circles formed by broken lines indicate the location at which the thyristors 5.1 to 5.6 can be soldered with their respective anodes 8. Small circles formed by broken lines indicate the points at which contact legs 10 are soldered. Rectangles formed by broken lines indicate the areas onto which the R, S and T phase contacts as well as plus and minus contacts are soldered. The contacts may lead upwards to external terminals on the housing.

FIG. 6 shows the structure of the conductor runs 9 in the conductor run plane II on the lower surface of the cover plate 3. FIG. 6 is a view which would be seen from above if the cover plate were transparent. The external dimensions of the cover plate 3 are somewhat smaller than those of the base plate 2 and specifically, they are reduced by the width of the edge 22 on the base plate 2, so that a housing can be placed over the cover plate 3. Cutouts are provided at the left and the right of the cover plate 3, so that only projections 23 are left standing for guiding the housing. Flat plugs for the contacts R, S, T as well as for the plus and minus contacts may be brought upwards in the cutouts. A large hole 24 is provided in the center of the cover plate 3 for subsequent filling of a housing surrounding the power module with casting compound. The substrates 2, 3 may also be considered to be a cover and a bottom of a housing. Broken line circles show where contact legs 10 are soldered for connecting the plane I to the plane II. The holes 11 indicate the center of the assembly location of the respective thyristors 5.1 to 5.6. The small holes 15 for bringing through the cathode wires 16 are disposed close to the holes 11 for the thyristors 5.1, 5.3 and 5.5. The common cathode potential of the thyristors 5.2, 5.4 and 5.6 is brought through a hole 25 into the plane III with a wire 16. A contact post 10 is disposed below the hole 25.

FIG. 7 shows the structure of the conductor runs 9 in the plane III on the upper surface of the cover plate 3. The through-holes 11, 15, 24, 25 were explained already within the scope of the description of FIG. 6. Broken line rectangles indicate the surfaces for soldering wires for the auxiliary cathode terminals HK5.1 to HK 5.6 and gate terminals G5.1 to G5.6 for controlling the thyristors 5.1 to 5.6.

No complicated soldering form is required for fabricating the semiconductor power module according to the invention, but only a simple soldering frame into which the base plate 2, the semiconductor sandwich 6 to be soldered on, the contact leg 10 and the cover plate 3, are sequentially inserted. Sleeves 12 are placed into the holes 11 and wires 14, 16 are placed in the sleeves 12 as well as into the holes 15, 25. In addition, flat connectors for the contacts are inserted. The parts are presoldered and, if necessary, solder foils are placed inbetween. All of the parts are connected to each other in one soldering operation.

As already mentioned, a semiconductor power module 1 which is constructed in the form of a sandwich, can be inserted into a plastic housing and cast full with compound. However, the module 1 according to the invention can also be used without a housing of its own, such as in another component within the frame of a more extensive device which is encapsulated as a whole.

In a module 1 according to the invention, a base plate 2 can also be used as the bottom of the housing and an upper substrate 3 as the housing cover. Such a module 1 can be contacted at the top and the bottom by a heat sink. Terminals can be brought out laterally in such a device.

The foregoing is a description corresponding in substance to German Application No. P 34 06 528.8, filed Feb. 23, 1984, the International priority of which is being claimed for the instant application, and which is hereby made part of this application. Any material discrepancies between the foregoing specification and the aforementioned corresponding German Application are to be resolved in favor of the latter.

We claim:

1. Semiconductor power module, comprising at least one upper substrate and at least one lower substrate, said substrates being mutually parallel and formed of ceramic, each substrate having upper and lower sides, metallizations disposed on at least said upper and lower sides of said upper substrate and said upper side of said lower substrate, at least one controlled semiconductor power component disposed between each two respective substrates and electrically contacted by said metallizations disposed on said lower side of said upper substrate and on said upper side of said lower substrate, defining a substrate above said component and a substrate below said component, said substrate above said component having at least one hole formed therein above said component for accommodating control connections to said component, said metallization disposed on said upper side of said upper substrate being structured.

2. Semiconductor power module according to claim 1 including a housing enclosing said substrates and casting compound at least partially filling said housing.

3. Semiconductor power module according to claim 1, wherein said metallization on one side of said lower substrate is structured to form conductor runs.

4. Semiconductor power module according to claim 1, wherein said sides of said substrates define conductor run planes, said metallizations are conductor runs disposed on two of said planes facing each other, and including contact posts interconnecting said conductor runs.

5. Semiconductor power module according to claim 1, wherein said metallization is structured and in the form of auxiliary control circuits.

6. Semiconductor power module according to claim 1, wherein said at least one component disposed between each two respective substrates is in the form of at least two components of different heights, and including compensating pieces disposed between at least one of said components and said substrates for compensating said different heights.

7. Semiconductor power module according to claim 1, including compensating pieces disposed between said component and said substrates for compensating mechanical stresses.

8. Semiconductor power module according to claim 1, including electrically insulating, heat resistant centering pins disposed in said at least one hole for positioning said component before and during soldering.

9. Semiconductor power module according to claim 1, including centering sleeves disposed in said at least one hole formed in said substrate above said component and in an opening formed in one of said compensating pieces above said component for positioning said component.

10. Semiconductor power module according to claim 1, wherein said component includes a gate terminal, said substrates are cover and base plates, said sides of said substrates define conductor run planes, said metallizations are conductor runs disposed on at least some of said planes, and including auxiliary control circuits disposed on one of said conductor runs on said cover plate facing away from said component, and a sleeve for positioning said component disposed in said hole having a rim with metallizations connecting conductor runs on both sides of said cover plate and, connecting said gate terminal to said conductor run for said auxiliary circuits.

11. Semiconductor power module according to claim 4, wherein said contact posts have contact surfaces contacting said conductor runs at given locations of said conductor runs fitted to said contact surfaces, said posts being held at said locations by capillary force for soldering.

12. Semiconductor power module according to claim 1, wherein said component includes a gate terminal, said sides of said substrates define conductor run planes, said metallizations are conductor runs disposed on said planes, and including auxiliary circuits disposed on one of said conductor runs, and presoldered contact wires passing through said hole and connecting said gate terminal to said conductor run on which said auxiliary circuits are disposed.

13. Semiconductor power module according to claim 1, wherein said substrates are base and cover plates, and said base plate is larger than said cover plate.

14. Semiconductor power module according to claim 1, wherein said metallizations are disposed on said substrates by direct bonding.

15. Semiconductor power module according to claim 1, wherein said substrates are base and cover plates, and including a heat sink contacting said base plate.

16. Semiconductor power module according to claim 1, including a heat sink contacting the upper surface of said substrate disposed above said component.

17. Semiconductor power module according to claim 1, including contact pins emerging laterally to the surroundings.

18. Semiconductor power module according to claim 1, including a built-in integrated circuit with addressing and control functions.

19. Semiconductor power module according to claim 1, wherein said substrates are in the form of an upper substrate and a base plate respectively forming a cover and a bottom of a housing.

* * * * *